United States Patent [19]
Ho et al.

[11] Patent Number: 5,818,751
[45] Date of Patent: Oct. 6, 1998

[54] SINGLE-PORT SRAM WITH NO READ/WRITE COLLISIONS

[75] Inventors: Yung-Yuan Ho; Nang-Ping Tu, both of Hsinchu; Jian-Yau Yih, Taoyuan Hsien, all of Taiwan

[73] Assignee: Industrial Technology Research Institute, Hsinchu, Taiwan

[21] Appl. No.: 925,358

[22] Filed: Sep. 8, 1997

[30] Foreign Application Priority Data

Jun. 21, 1997 [TW] Taiwan ................................. 86108692

[51] Int. Cl.⁶ ................................................. G11C 11/00
[52] U.S. Cl. .................... 365/154; 365/156; 365/230.06; 365/233
[58] Field of Search ...................................... 365/154, 156, 365/230.06, 233

[56] References Cited

U.S. PATENT DOCUMENTS 5,272,678 12/1993 Yoshikawa .......................... 365/230.06
5,675,548 10/1997 Yokayama et al. .................. 365/230.06

*Primary Examiner*—Huan Hoang
*Attorney, Agent, or Firm*—Ladas & Parry

[57] ABSTRACT

A single-port SRAM with no read/write collisions. The present invention uses some X-axis and Y-axis control circuits to reduce the amounts of lines used in the structure of the present invention, but still maintains circuitry stability.

8 Claims, 6 Drawing Sheets

SINGLE-PORT SRAM WITH NO READ/WRITE COLLISIONS

BACKGROUND OF THE INVENTION

1. Field of the Invention

The present invention relates to an integrated circuit memory device, and especially relates to a single-port static random access memory (SRAM) with no read/write collisions.

2. Description of the Related Art

Static random access memory (SRAM), a common memory device, is classified as a volatile memory where any data stored is erased when power supply to the SRAM is turned off. Data is stored in an SRAM through manipulation of the conduction state in the transistors of internal memory cells. This differs from the way data is stored in a dynamic random access memory (DRAM) which is another kind of volatile memory device. Data storage in DRAM involves manipulation of the charging state of internal capacitors. The access speed for SRAM is rather fast, so SRAM is often used as cache memory in computer systems and real-time applications.

FIG. 1A depicts a circuit diagram of an SRAM memory cell in an NMOS logic circuit. Transistors M1, M2, M3 and M4 form a latch circuit, wherein transistors M3 and M4 are used as active loads; and the logic level of the logic signal produced at terminal X is different from that produced at terminal Y. The way data is read or written to the SRAM shown in FIG. 1A is as follows. Word-line W is addressed to control the on/off states of transistors M5 and M6. Bit-line B and bit-line B̄ respectively control the read/write logic values at terminal X and Y.

FIG. 1B depicts a circuit diagram of an SRAM memory cell in a CMOS logic circuit. The SRAM memory cell shown in FIG. 1B is similar to that shown in FIG. 1A, except that the latch circuit comprises CMOS circuits. Transistors M7, M8, M9 and M10 form a latch circuit, wherein transistors M7 and M8 are NMOS transistors; and transistors M9 and M10 are PMOS transistors. In data read/write operations, transistors M11 and M12 control the data access path. The way that data is read from or written to the SRAM memory cell in a CMOS logic circuit is the same as that of an NMOS logic circuit.

From FIG. 1A and FIG. 1B, it is apparent that SRAM suffers from the disadvantage of relying on too many transistors. In NMOS or CMOS logic circuits, each memory cell consists of 6 transistors. In latch circuits, some of the transistors, which may be used as active loads, can be replaced by polysilicon resistors, but this kind of memory cell still needs at least 4 transistors. In other words, SRAM is far less integrated than DRAM, and thus the cost of SRAM is relatively high. Accordingly, there is an important need to decrease cost of embedded SRAM.

In some video and audio applications, SRAM is needed to perform read/write operations simultaneously. The configuration of SRAM is stated as follows. Memory cells, shown in FIG. 1A or 1B, are arranged in arrays. Memory cells in the same row are addressed by the same word-line, and memory cells in the same column use the same bit-line to perform data read/write operations. Beyond arrays, there are peripheral circuits which process data read/write, for example, row decoders, column decoders, sense amplifiers, etc. SRAM has common word-lines along the X-axis direction, and common bit-lines along the Y-axis direction. When read/write operations are executed simultaneously; or the speed of reading is not the same with that of writing, a read/write collision occurs. Thus, there is a need to use two-port SRAM as a data buffer for read/write operations.

However, in the prior art, SRAM, which performs read/write simultaneously, utilities a two-port structure to prevent read/write collision. That means, in an SRAM, there are two independent memory ports with a common address, a common memory cell length, and an interlaced read/write sequence. When the first memory port performs data write, the second memory port performs data read, and vice versa. Data read and write operations are successive in circuits exterior to this kind of SRAM, i.e., SRAM performs reading and writing simultaneously. Therefore, two-port SRAM is suitable for real-time applications.

Obviously, two-port SRAM requires more memory cells and takes up more chip space. Two-port SRAM uses 12 transistors for each memory cell address,. This reduces the degree of SRAM integration and raises the cost.

SUMMARY OF THE INVENTION

Therefore, the main subject of the present invention is to provide a single-port SRAM with variable read/write speed and no read/write collisions. In the present invention, Y-axis control circuits are used to integrate the read-word-lines and the write-word-lines into word-lines, and X-axis control circuits are used to integrate read-bit-lines and write-bit-lines into bit-lines. By this kind of configuration, the SRAM of the present invention still prevents read/write collisions two-port structure, and keeps on using only 6 or 4 transistors in each memory cell. This highly raises integration of SRAM, and lowers fabrication cost.

The present invention provides a single-port SRAM with no read/write collisions, comprising: a plurality of memory cells, distributed in a memory cell array, each memory cell having independent data read/write paths, the read from and writing to the memory cell respectively controlled by a reading clock signal and a writing clock signal; a plurality of word-lines and bit-lines, respectively receiving a word-line control signal and a bit-line control signal to enable and address a predetermined memory cell for data read/write; a plurality of Y-axis control circuits, each coupled to the word-line, and receiving a reading word-line signal, a writing word-line signal, the reading clock signal, and the writing clock signal and outputting a word-line signal, wherein the word-line signal only enables a predetermined memory cell for reading data during a first-half period of the reading clock signal, and for writing data during a second-half period of the reading clock signal; and a plurality of X-axis control circuits, each coupled to the word-line, and receiving a reading bit-line signal, a writing bit-line signal, the reading clock signal, the writing clock signal, and a separation clock signal and outputting a bit-line signal, wherein the bit-line signal only enables a predetermined memory cell for reading data during a first-half period of the reading clock signal, and for writing data during a second-half period of the reading clock signal.

DESCRIPTION OF THE DRAWINGS

Other objectives, features, and advantages of the present invention will become apparent from the following detailed description made with reference to an illustrative but non-limiting embodiment. The description is made with reference to the accompanying drawings, in which.

DESCRIPTION OF THE PREFERRED EMBODIMENT

Figure 2A:
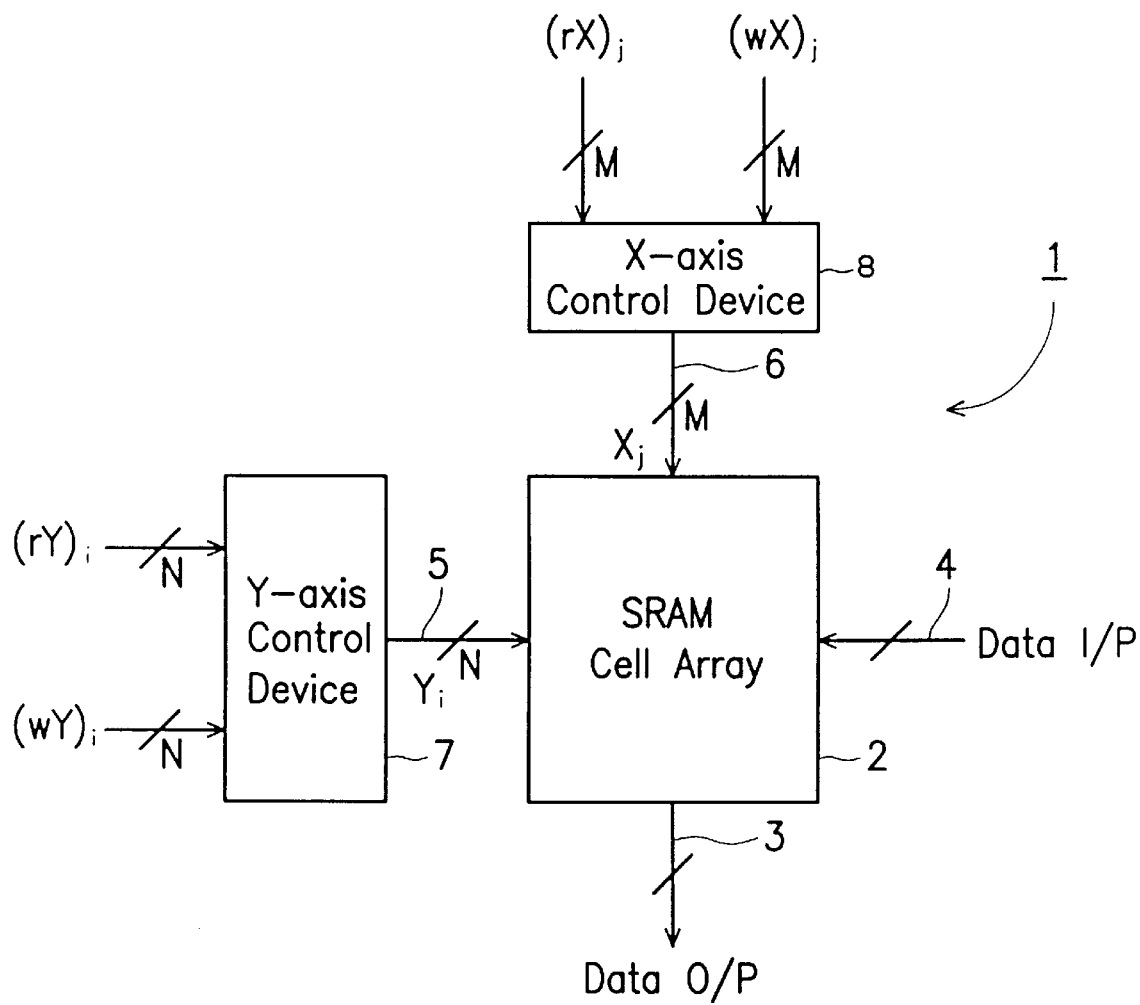
FIG. 2A depicts a configuration of a single-port SRAM with no read/write collisions according to the present invention.

FIG. 2A depicts a configuration 1 of a single-port SRAM with no read/write collisions according to the present invention. The configuration 1 comprises a memory cell array 2 distributed from a plurality of memory cells. Each memory cell has an independent data read/write path. A reading clock signal $R_{CLK}$ and a writing clock signal $W_{CLK}$ respectively control the read/write sequence of memory cells.

In this embodiment, the reading speed is double the writing speed. However, the present invention is not limited to this condition and is suitable when the reading speed is an integral multiple of the writing speed, or the writing speed is an integral multiple of the reading speed.

A plurality of word-lines 5, and a plurality of bit-lines 6 respectively receive word-line signals $Y_1, Y_2, \ldots Y_i, \ldots Y_N$, and bit-line signals $X_1, X_2, \ldots X_j, \ldots X_N$, to enable a predetermined memory cell for data reading or writing, wherein N and M respectively present amounts of word-lines and bit-lines.

A Y-axis control device 7 comprises a plurality of Y-axis control circuits (not shown), each coupled to a plurality of word-lines 5, at least receiving a reading word-line signal $(rY)_i$, a writing word-line signal $(wY)_i$, the reading clock signal $R_{CLK}$, and the writing clock signal $W_{CLK}$ and outputting the word-line signal $Y_i$ to a related word-line 5, wherein $1 \leq i \leq N$.

An X-axis control device 8 comprises a plurality of X-axis control circuits (not shown), each coupled to a plurality of bit-lines 6, at least receiving a reading bit-line signal $(rX)_j$, a writing bit-line signal $(wX)_j$, the reading clock signal $R_{CLK}$, and the writing clock signal $W_{CLK}$ and outputting the bit-line signal $X_j$ to a bit-line 6, wherein $1 \leq j \leq M$. The memory cell array 2 addresses a predetermined memory cell for read/write via word-lines 5, and bit-lines 6.

In the prior art, when read/write operations are simultaneously performed in the same single-port SRAM, and the reading speed is not same as the writing speed, two kinds of read/write collisions are occurred. The two collisions are as follows.

1. When the read/write locations are in the same memory cell, i.e., the read and write operations are located on the same word-line and bit-line (i.e. the same location on Y-axis and X-axis); or 2. when the read and write operations are located on the same bit-line, but different word-line, (i.e. the same location on X-axis, but different location on Y-axis).

First Kind of Read/Write Collision and Method for Prevention Thereof

When the read and write operations are located on the same location on Y-axis and X-axis to prevent erroneous reading or writing of data, the present invention reads data from the memory cell first, and then writes data to the memory cell. So, signal $X_j$ (wherein $1 \leq j \leq M$, M is the amount of bit-lines) on any bit-line alternately outputs a bit-line reading enabling signal $(readX)_j$, and a bit-line writing enabling signal $(writeX)_j$ to respectively read data from or write data to the memory cell.

In the present invention, X-axis control circuits perform a simple logic operation on signals received to separate data reading from writing and prevent read/write collisions. One possible logic operation of X-axis control circuits is $$X_j = (readX)_j + (writeX)_j \qquad \text{op. (1)}$$
$$= R_{CLK} \cdot (rX)_j + \overline{W_{CLK}} \cdot (wX)_j \cdot \overline{R_{CLK}} \cdot \overline{S_{CLK}}$$

Figure 4:
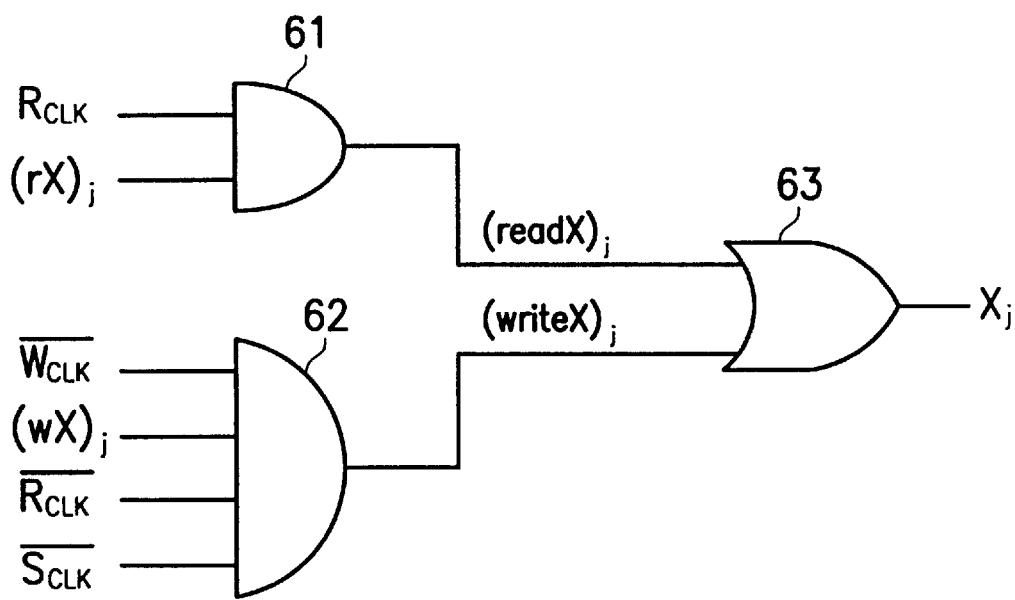
FIG. 4 shows a circuit diagram of an X-axis control circuit performing the timing sequence shown in FIG. 3 of the present invention.

Now, referring to FIG. 4, an X-axis control circuit comprising: an X-axis AND gate 61, receiving a reading clock signal $R_{CLK}$, and a reading bit-line signal $(rX)_j$ and outputting a bit reading enabling signal $(readX)_j$; an X-axis AND gate 62, receiving a signal $\overline{W_{CLK}}$ inverted from a writing clock signal $W_{CLK}$, a signal $\overline{R_{CLK}}$ inverted from a reading clock signal $R_{CLK}$, a signal $S_{CLK}$ inverted from a separation signal $S_{CLK}$, and a writing bit-line signal $(wX)_j$ to output a bit writing enabling signal $(writeX)_j$; and an X-axis OR gate 63, receiving the bit reading enabling signal $(readX)_j$ and the bit writing enabling signal $(writeX)_j$ to output a bit-line signal $X_j$.

Through this logic operation, data reading and writing are respectively performed in the first and second half period of the reading clock $R_{CLK}$ to prevent erroneous data read/write. Separation signal $S_{CLK}$, whose period is half of reading clock period, completely separates data reading from writing. During the first half period of the reading clock, the logic is high. The signals and timing sequence of the bit-line 6 are shown as FIG. 3. FIG. 4 depicts a preferred embodiment of an X-axis control circuit.

Figure 3:
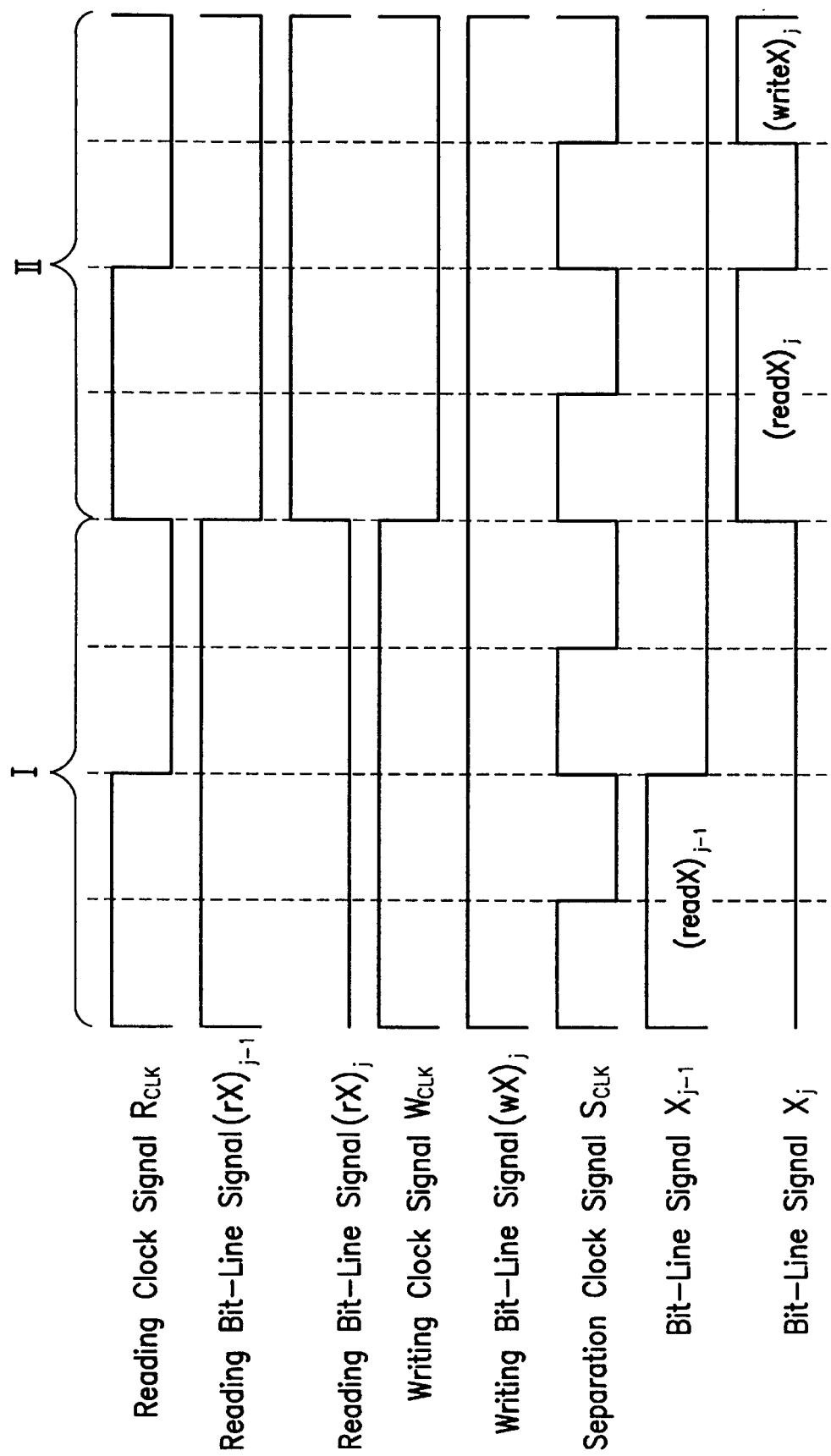
FIG. 3 shows a timing sequence chart for data reading by an X-axis control circuit according to the present invention.

Now referring to FIG. 3 and op.(1), a (j−1)th bit-line outputs a $(readX)_{j-1}$ signal; and a memory cell performs data reading during the first half of period I of the reading clock signal $R_{CLK}$.

In the period II of the reading clock signal $R_{CLK}$, a memory cell on the j-th bit-line performs read/write simultaneously. Through op.(1) in the first half of period II of the reading clock signal $R_{CLK}$, the bit-line control signal $X_j$ is a bit-line reading enabling signal $(readX)_j$ to read data in a related memory cell. In the second half of period II of the reading clock signal $R_{CLK}$, the bit-line control signal $X_j$ is of a bit-line writing enabling signal $(writeX)_j$ which matches a separation clock signal $S_{CLK}$ in limiting the data writing to the last quarter of period II of the reading clock signal $R_{CLK}$ in order to separate data reading from data writing. Because the period of data writing only occupies one quarter of the reading clock, power consumption is lowered. Applying the X-axis control circuit of the present invention prevents read/write collisions.

Second Kind of Read/Write Collision and Method for Prevention Thereof

Figure 2B:
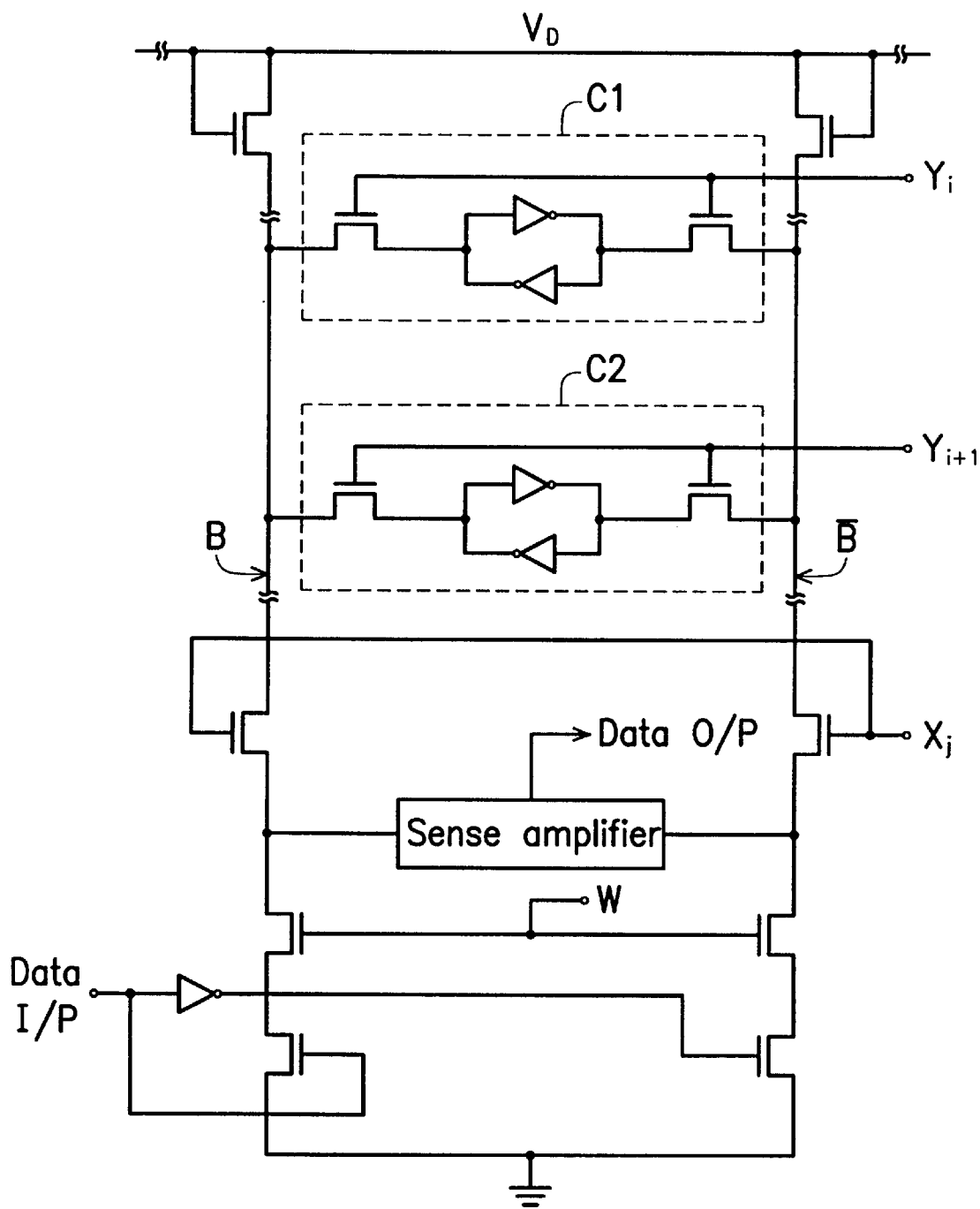
FIG. 2B depicts an internal configuration of a general SRAM in CMOS logic.

FIG. 2B depicts an internal configuration of a general SRAM in CMOS logic. Data read/write operations performed at the same X-axis location $(X_i)$ but at different Y-axis locations $(Y_j$ and $Y_{j+1})$ mean that data of a memory cell C1 is read to data O/P, and data on data I/P is written into a memory cell C2. In FIG. 2B, W is a write enabling signal.

Figure 1A:
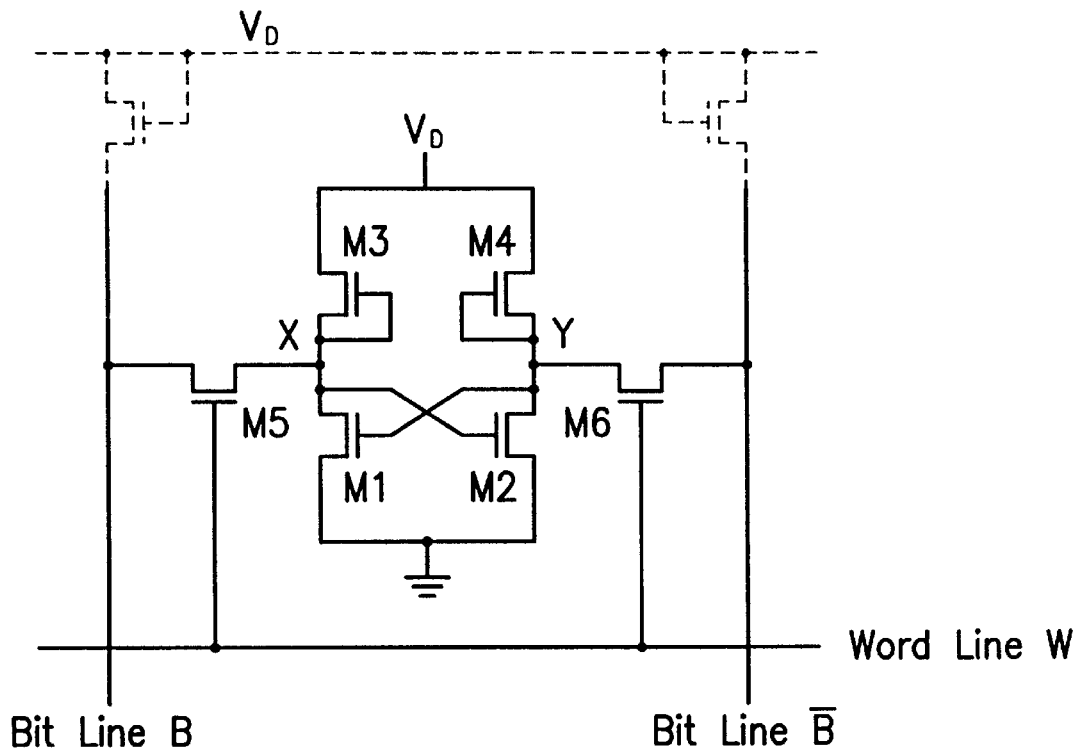
FIG. 1A depicts a circuit diagram of an SRAM memory cell in NMOS logic of the prior art.
Figure 1B:
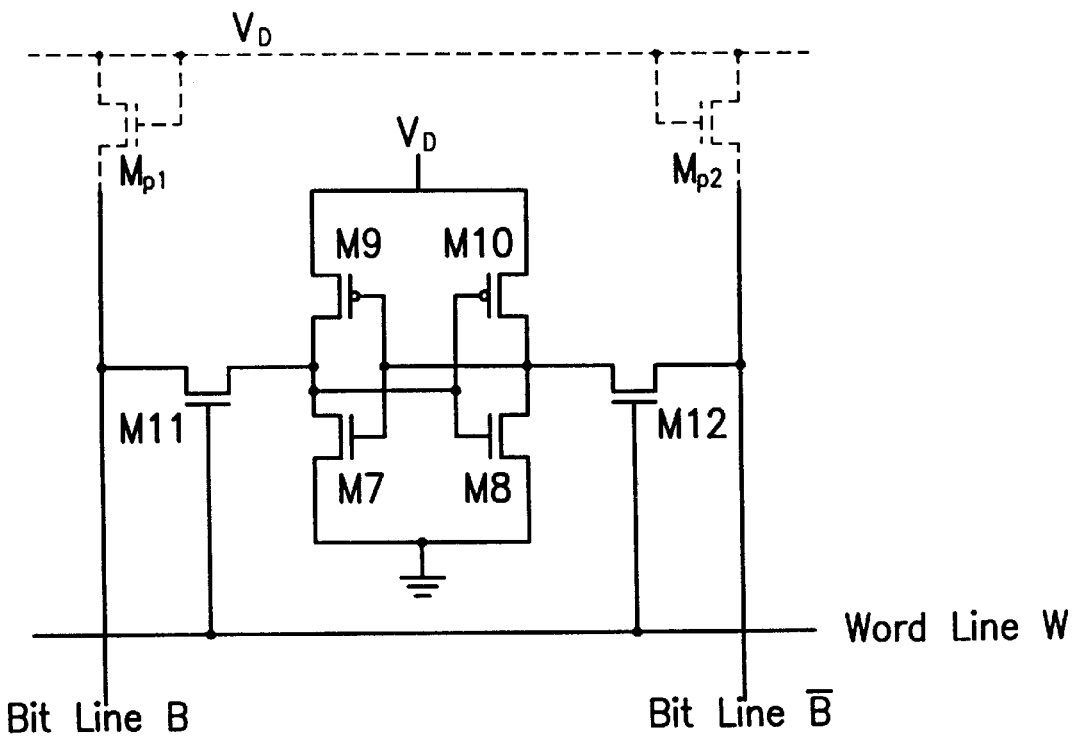
FIG. 1B depicts a circuit diagram of an SRAM memory cell in CMOS logic of the prior art.

Because memory cells on the same X-axis location use a common bit-line (for example, bit-line B and bit-line $\overline{B}$, shown in FIG. 1B), data may be read from or written to memory cells C1 and C2 simultaneously and a erroneous data transmission may occur. This means that data, which is intended to be written into memory cell C1, is written into memory cell C2, or data that is intended to be read from memory cell C1, is read from memory cell C2.

In order to prevent such erroneous data transmission, the present invention uses Y-axis control circuits to modify an output signal $Y_i$, of any word-line on Y-axis direction, to enable one memory cell for data reading or writing in a single period.($1 \leq i \leq N$, N representing the amounts of word-lines). That means the output signal $Y_i$, on the word-line, alternately outputs a word read enabling signal (readY)$_i$ or a word write enabling signal (writeY)$_i$ to a related word-line for locating a memory cell to perform data read/write. By interlacing the reading and writing period, a read/write collision is prevented. The present invention forms a logic operation on signals received by each Y-axis control circuit to separate the period of data read/write and prevent read/write collisions. One possible logic operation is:

$$Y_i = (readY)_i + (writeY)_i \qquad \text{op. (2)}$$
$$= R_{CLK} \cdot (rY)_i + \overline{W_{CLK}} \cdot (wY)_i \cdot \overline{R_{CLK}}$$

Figure 6:
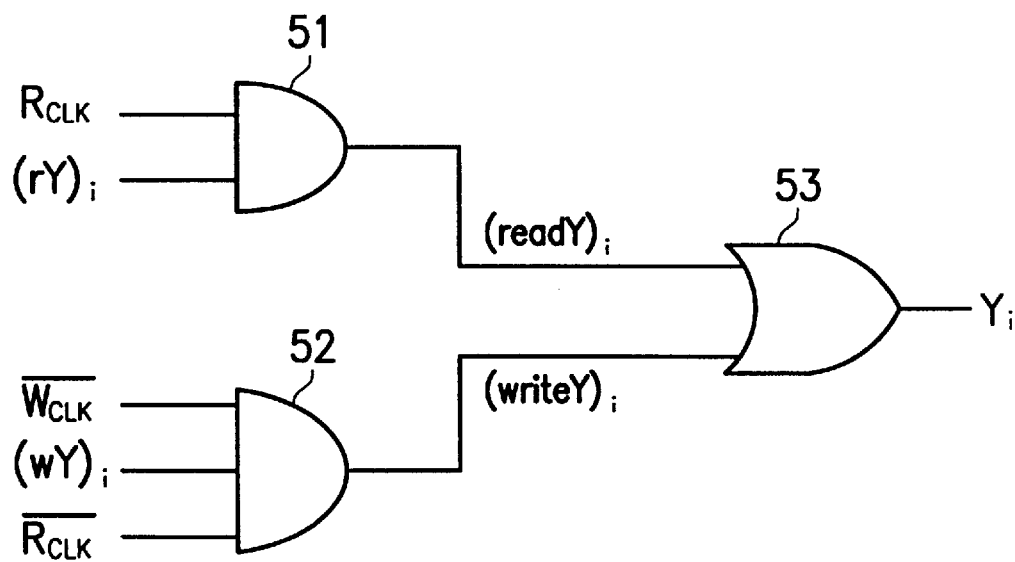
FIG. 6 shows a circuit diagram of a Y-axis control circuit performing the timing sequence shown in FIG. 5 according to the present invention.

Now, referring to FIG. 6, a Y-axis control circuit 5 comprises: a Y-axis AND gate 51, receiving a reading clock signal $R_{CLK}$, and a reading word-line signal (rY)$_i$ to output a word reading enabling signal (readY)$_{i+1}$; a Y-axis AND gate 52, receiving a signal $W_{CLK}$ inverted from a writing clock signal $W_{CLK}$, a signal $R_{CLK}$ inverted from a reading clock signal $R_{CLK}$, and a word writing signal (wY)$_i$ to output a word write enabling signal (writeY)$_i$; and a Y-axis OR gate 53, receiving the word read enabling signal (readY)$_i$ and the word write enabling signal (writeY)$_i$ to output a word-line.

Via this logic operation, data reading and writing are respectively performed during the first and second half period of the reading clock.

Figure 5:
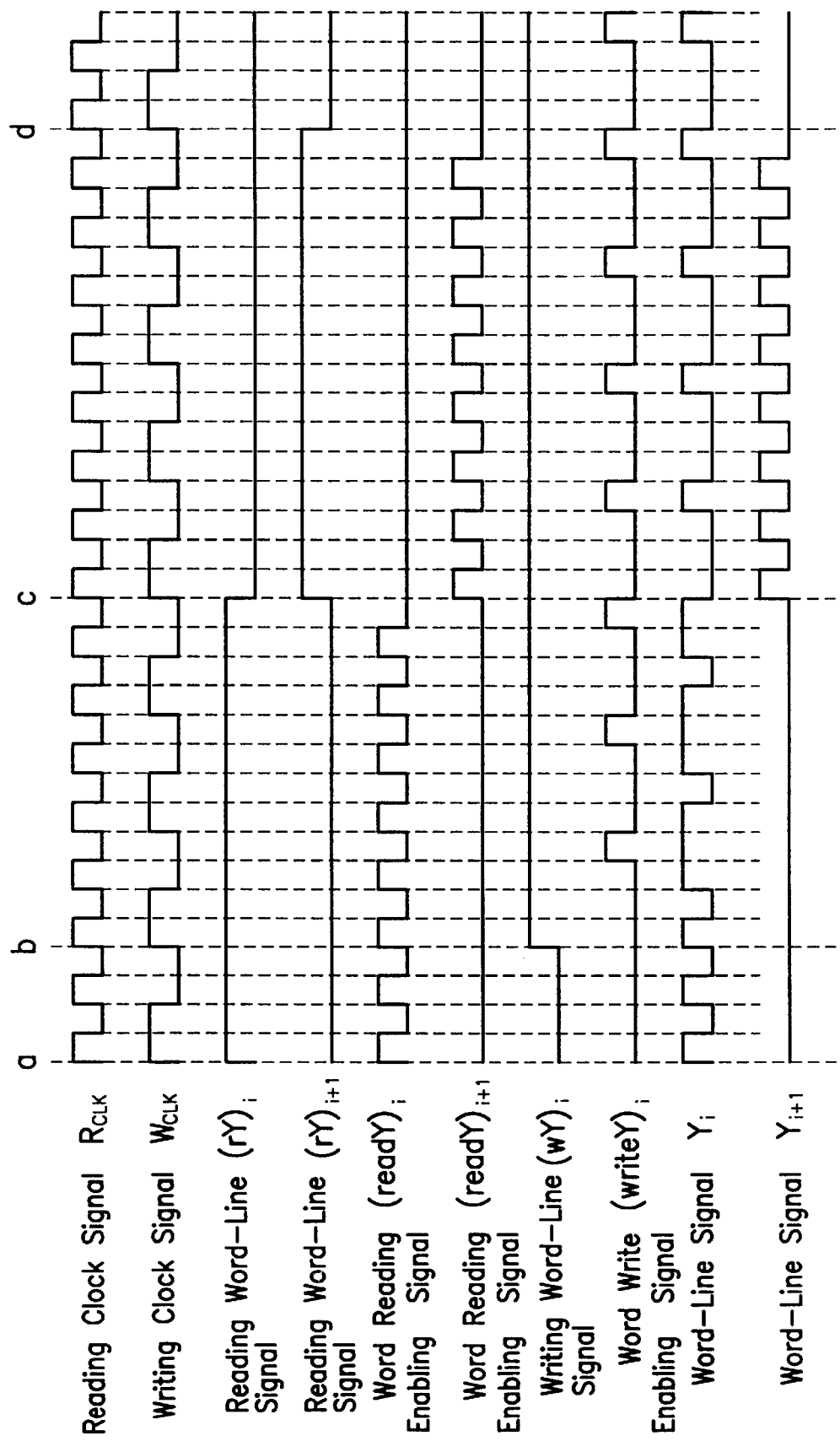
FIG. 5 shows a timing sequence chart for data reading by a Y-axis control circuit according to the present invention.

Now, referring to FIG. 5 and the op.(2), in the b-c period, the i-th Y-axis control circuit simultaneously receives a reading word-line signal (rY)i and a writing word-line signal (wY)$_i$. Via the result of op.(2), a reading word-line signal (readY)$_i$, which is output during the first half period of the reading clock signal $R_{CLK}$, is integrated with a writing word-line signal (writeY)$_i$, which is output in the second half period of the reading clock signal $R_{CLK}$, into a word-line signal $Y_i$. In concert with X-axis control circuits, read/write collisions are prevented.

In the c-d period, an (i+1)th Y-axis control circuit receives a reading word-line signal (rY)$_{i+1}$, so the memory cell on the (i+1)th Y-axis control circuit is enabled for sequential reading. At this moment, some memory cells on the i-th word-line are still performing data writing. During the first half period of the reading clock signal $R_{CLK}$, a reading word-line signal (readY)$_{i+1}$ is output to the (i+1)th word-line as a word-line control signal $Y_{i+1}$. During the second half period of the reading clock signal $R_{CLK}$, a writing word-line signal (writeY)i is output to the i-th word-line as a word-line control signal $Y_i$. Even if data read/write operations are performed on the same X-axis location, read/write collisions are prevented because the period of data reading is interlaced with that of data writing.

In addition to prevent read/write collisions, the present invention can reduce the layout area because the present invention uses additional and small control circuits to replace the two-port structure with a single-port structure. The comparison is stated below.

The layout area of the prior art (two-port read/write SRAM) is obtained as below. The layout area of 1-bit SRAM is 15 μm×18 μm. So, the layout length in X-axis of a single-port SRAM of 664 (8×83) memory cells is 15 μm×8× 8=960 μm, wherein the second multiplier 8 comes from the fact that there are 8 bits in a memory cell. The layout length in Y-axis of a single-port SRAM of 664 memory cells is 18 μM×83+60 μm=1634 μm. The layout area for 664 memory cell of two-port read/write SRAM is 960 μm×1634 μm×2.

The layout area of the present invention is obtained as below. Because the present invention does not alter the SRAM structure, the layout area of single-port SRAM of 664 memory cells is still 960 μm×1634 μm. The layout length of additional X-axis control circuits in the X-axis is 15 μm×8×8=960 μm, and in the Y-axis, the layout length is 30 μm×4=120 μm. Therefore, the layout area of addition X-axis control circuits is 960 μm×120 μm. The layout length of additional Y-axis control circuits in the X-axis is 65 μm, and in the Y-axis, the layout length is 18 μm×83=1494 μm. Therefore, the layout area of additional Y-axis control circuits is 65 μm×1494 μm. The layout area for 664 memory cells of the single-port SRAM of the present invention is 960 μm×1634 μm+960 μm×120 μm+65 μm×1494 μm. The area ratio of the prior art and the present invention is 2:1.14.

Compared with the prior art, the advantages of the present invention are stated as below.

1. A Smaller Layout Area

By applying additional and small-area control circuits, the layout area of the present invention requires only about half the number of the prior art as discussed above. However, the present invention only alters the on/off timing sequence of bit-lines and word-lines, the SRAM circuit structure and stability still remain.

2. Broader Application

The data reading speed can be several integral multiples of the data writing speed, and vice versa. So the present invention can be more broadly applied than the prior art.

3. Lower Power Consumption

Because the layout of the present invention requires only about half the area of the prior art, the power consumption of the present invention is only about half that of the prior art.

If the reading clock signal $R_{CLK}$ has the same period as the writing clock signal $W_{CLK}$, the data reading speed is the same the data writing speed. If the reading clock signal $R_{CLK}$ has a different period from the writing clock signal $W_{CLK}$, the data reading speed is different from the data writing speed. If the period of the reading clock signal $R_{CLK}$ is several integral times of that of the writing clock signal $W_{CLK}$, the data writing speed is several integral multiples of data reading speed, and vice versa.

Having described the invention in connection with preferred embodiments, modifications will now doubtlessly be apparent to those skilled in this technology. The foregoing description of the preferred embodiments of the invention has been provided for the purposes of illustration and description. It is not intended to be exhaustive or to limit the invention to the precise embodiment disclosed herein. The disclosed embodiment has been chosen and described to best explain the principles of the invention and its practical application, thereby enabling others skilled in this technology to understand the invention, to practice various other embodiments thereof and to make various modifications suited to the particular use contemplated of the present invention. As such, it is intended that the scope of this invention shall not be limited to the disclosed, but rather shall be defined by the following claims and their equivalents.

What is claimed is:

1. A single-port SRAM with no read/write collisions, comprising:

a plurality of memory cells, distributed in a memory cell array, each having independent data read/write paths, a read/write sequence of said memory cell controlled by a reading clock signal and a writing clock signal;

a plurality of word-lines, receiving a word-line control signal for enabling and reading from or writing to a specific memory cell;

a plurality of bit-lines, receiving a bit-line control signal for enabling and reading from or writing to a specific memory cell;

a plurality of Y-axis control circuits, respectively coupled to each word-line, each receiving a reading word signal, a writing word signal, said reading clock signal, and said writing clock signal to output said word-line control signal, wherein said word-line control signal enables a specific memory cell on a related word-line of said Y-axis control circuit for data reading during a first half period of said reading clock signal; and said word-line control signal enables a specific memory cell on a related word-line of said Y-axis control circuit for data writing during a second half period of said reading clock signal; and a plurality of X-axis control circuits, coupled to said bit-line, each receiving a reading bit-line signal, a writing bit-line signal, said reading clock signal, said writing clock signal, and a separation clock to output said bit-line control signal, wherein said bit-line control signal enables a specific memory cell on a related bit-line of said X-axis control circuit for data reading during a first half period of said reading clock signal; and said bit-line control signal enables a specific memory cell on a related bit-line of said X-axis control circuit for data writing during a second half period of said reading clock signal.

2. The single-port SRAM of claim 1, wherein said Y-axis control circuit comprises:

a first Y-axis AND gate, receiving said reading clock signal, and said reading word-line signal to output a word read enabling signal;

a second Y-axis AND gate, receiving a signal inverted from said writing clock signal, a signal inverted from said reading clock signal, and said word writing signal to output an word write enabling signal; and a Y-axis OR gate, receiving said word read enabling signal and said word write enabling signal to output said word-line signal.

3. The single-port SRAM of claim 1, wherein said X-axis control circuit comprises:

a first X-axis AND gate, receiving said reading clock signal, and said reading bit-line signal to output a bit read enabling signal;

a second X-axis AND gate, receiving a signal inverted from said writing clock signal, a signal inverted from said reading clock signal, a signal inverted from said separation clock, and said bit writing signal to output an bit write enabling signal; and an X-axis OR gate, receiving said bit read enabling signal and said bit write enabling signal to output said bit-line control signal.

4. The single-port SRAM of claim 1, wherein said separation clock, whose period is half the period of said reading clock signal, limits said bit-line control signal for enabling a specific memory cell for data writing.

5. The single-port SRAM of claim 1, wherein said reading clock signal has the same period as said writing clock signal.

6. The single-port SRAM of claim 1, wherein said reading clock signal has a different period from said writing clock signal.

7. The single-port SRAM of claim 1, wherein the period of said reading clock signal is several integral multiples of said writing clock signal period.

8. The single-port SRAM of claim 1, wherein the period of said writing clock signal is several integral multiples of said reading clock signal period.

* * * * *